(12) United States Patent
Kikuchi et al.

(10) Patent No.: US 8,530,989 B2
(45) Date of Patent: Sep. 10, 2013

(54) SOLID-STATE IMAGING APPARATUS AND IMAGING SYSTEM

(75) Inventors: Shin Kikuchi, Isehara (JP); Yuichiro Yamashita, Ebina (JP); Masaru Fujimura, Yokohama (JP); Shoji Kono, Hachioji (JP); Yu Arishima, Yokohama (JP); Shinichiro Shimizu, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 173 days.

(21) Appl. No.: 13/157,404

(22) Filed: Jun. 10, 2011

(65) Prior Publication Data

US 2012/0007197 A1 Jan. 12, 2012

(30) Foreign Application Priority Data

Jul. 7, 2010 (JP) .................................. 2010-155256

(51) Int. Cl.
*H01L 31/115* (2006.01)
(52) U.S. Cl.
USPC ................... 257/429; 257/435; 257/E27.132
(58) Field of Classification Search
USPC .................................. 257/429, 435, E27.132
See application file for complete search history.

(56) References Cited

U.S. PATENT DOCUMENTS

| | | | |
|---|---|---|---|
| 4,954,895 A | 9/1990 | Akimoto et al. | 358/213.11 |
| 5,245,203 A | 9/1993 | Morishita et al. | |
| 5,352,920 A | 10/1994 | Morishita et al. | |
| 6,239,839 B1 | 5/2001 | Matsunaga et al. | 348/308 |
| 6,780,666 B1 | 8/2004 | McClure | 438/57 |
| 6,900,480 B2 | 5/2005 | Sugiyama | 257/222 |
| 6,906,793 B2 | 6/2005 | Bamji et al. | 356/141.1 |
| 6,960,751 B2 | 11/2005 | Hiyama et al. | |
| 6,965,135 B2 | 11/2005 | Sugiyama | 257/222 |
| 6,969,877 B2 | 11/2005 | Sugiyama | 257/222 |
| 6,974,980 B2 | 12/2005 | Sugiyama | 257/222 |
| 7,016,089 B2 | 3/2006 | Yoneda et al. | |
| 7,321,110 B2 | 1/2008 | Okita et al. | |
| 7,348,615 B2 | 3/2008 | Koizumi | |

(Continued)

FOREIGN PATENT DOCUMENTS

| | | |
|---|---|---|
| CN | 101197386 A | 6/2008 |
| CN | 101395718 A | 3/2009 |

(Continued)

OTHER PUBLICATIONS

Official Letter/Search Report dated Nov. 30, 2011, issued by the European Patent Office in European Patent Application No. 11168892.5.

*Primary Examiner* — Phuc Dang
(74) *Attorney, Agent, or Firm* — Fitzpatrick, Cella, Harper & Scinto (57) ABSTRACT

A solid-state imaging apparatus comprising a plurality of pixels each including a photoelectric conversion element, and a light shielding layer which covers the photoelectric conversion element is provided. The light shielding layer comprises a first light shielding portion which covers at least part of a region between the photoelectric conversion elements that are adjacent to each other, and a second light shielding portion for partially shielding light incident on the photoelectric conversion element of each of the plurality of pixels. An aperture is provided for the light shielding layer, the remaining component of the incident light passing through the aperture. A shape of the aperture includes a cruciform portion including a portion extending in a first direction and a portion extending in a second direction that intersects the first direction.

10 Claims, 10 Drawing Sheets

(56) References Cited

U.S. PATENT DOCUMENTS

| | | |
|---|---|---|
| 7,408,210 B2 | 8/2008 | Ogura et al. |
| 7,429,764 B2 | 9/2008 | Koizumi et al. |
| 7,456,888 B2 | 11/2008 | Kikuchi |
| 7,460,162 B2 | 12/2008 | Koizumi et al. |
| 7,547,871 B2 | 6/2009 | Hiyama et al. |
| 7,550,793 B2 | 6/2009 | Itano et al. |
| 7,554,591 B2 | 6/2009 | Kikuchi et al. |
| 7,623,056 B2 | 11/2009 | Yamashita |
| 7,633,539 B2 | 12/2009 | Yamashita |
| 7,679,658 B2 | 3/2010 | Sakurai et al. |
| 7,755,688 B2 | 7/2010 | Hatano et al. |
| 7,808,537 B2 | 10/2010 | Fujimura et al. |
| 7,817,199 B2 | 10/2010 | Yamashita et al. |
| 7,852,393 B2 | 12/2010 | Kikuchi et al. |
| 7,907,196 B2 | 3/2011 | Ogura et al. |
| 7,928,477 B2 | 4/2011 | Kobayashi et al. |
| 7,948,540 B2 | 5/2011 | Ogura et al. |
| 7,961,237 B2 | 6/2011 | Hatano et al. |
| 8,330,195 B2 | 12/2012 | Venezia et al. ............... 257/294 |
| 2001/0013901 A1 | 8/2001 | Matsunaga et al. ........... 348/308 |
| 2002/0149688 A9 | 10/2002 | Matsunaga et al. ........... 348/308 |
| 2003/0160887 A1 | 8/2003 | Takahashi ..................... 348/350 |
| 2003/0164887 A1 | 9/2003 | Koizumi et al. ............. 348/308 |
| 2003/0169360 A1 | 9/2003 | Rhodes .......................... 348/308 |
| 2005/0127415 A1 | 6/2005 | Yuzurihara et al. ........... 257/292 |
| 2006/0082669 A1 | 4/2006 | Inoue et al. ................... 348/308 |
| 2007/0109437 A1 | 5/2007 | Funaki et al. ................. 348/308 |
| 2007/0205354 A1 | 9/2007 | Li ................................. 250/208.1 |
| 2008/0068480 A1 | 3/2008 | Okita et al. |
| 2008/0273093 A1 | 11/2008 | Okita et al. |
| 2009/0085135 A1 | 4/2009 | Bang ............................. 257/432 |
| 2009/0134433 A1 | 5/2009 | Jung ............................. 257/239 |
| 2009/0201400 A1 | 8/2009 | Zhang et al. .................. 348/296 |
| 2009/0218479 A1 | 9/2009 | Arishima et al. |
| 2009/0244328 A1 | 10/2009 | Yamashita |
| 2009/0251578 A1 | 10/2009 | Yamashita |
| 2009/0284632 A1 | 11/2009 | Onuki et al. |
| 2009/0303364 A1 | 12/2009 | Shibata et al. |
| 2010/0002114 A1 | 1/2010 | Ogura et al. |
| 2010/0053398 A1 | 3/2010 | Yamashita |
| 2010/0079635 A1* | 4/2010 | Yano et al. .................... 348/294 |
| 2010/0149366 A1 | 6/2010 | Noda et al. |
| 2010/0165159 A1 | 7/2010 | Kumesawa ................... 348/294 |
| 2010/0165167 A1 | 7/2010 | Sugiyama et al. |
| 2010/0198482 A1 | 8/2010 | Hartmann et al. |
| 2010/0200738 A1 | 8/2010 | Yamashita |
| 2010/0201834 A1* | 8/2010 | Maruyama et al. ........ 348/222.1 |
| 2010/0225793 A1 | 9/2010 | Matsuda et al. |
| 2010/0231767 A1 | 9/2010 | Kikuchi |
| 2010/0327148 A1 | 12/2010 | Chung et al. ................ 250/208.1 |
| 2010/0328302 A1 | 12/2010 | Yamashita et al. |
| 2010/0328509 A1 | 12/2010 | Yamashita et al. |
| 2011/0007173 A1 | 1/2011 | Takenaka et al. |
| 2011/0013062 A1 | 1/2011 | Yamashita |
| 2011/0025896 A1 | 2/2011 | Yamashita et al. |
| 2011/0032379 A1 | 2/2011 | Kobayashi et al. |
| 2011/0032404 A1 | 2/2011 | Kikuchi |
| 2011/0068253 A1 | 3/2011 | Arishima et al. |
| 2011/0080492 A1 | 4/2011 | Matsuda et al. |
| 2011/0080493 A1 | 4/2011 | Kono et al. |
| 2011/0121404 A1 | 5/2011 | Shifren et al. ................. 257/392 |
| 2011/0134270 A1 | 6/2011 | Arishima et al. |
| 2011/0157441 A1 | 6/2011 | Okita et al. |
| 2011/0163407 A1 | 7/2011 | Yuzurihara et al. ........... 257/463 |
| 2011/0168872 A1 | 7/2011 | Kobayashi et al. |
| 2011/0169989 A1 | 7/2011 | Kono et al. |
| 2011/0234868 A1 | 9/2011 | Yamashita et al. |
| 2011/0242380 A1 | 10/2011 | Ogura et al. |
| 2013/0015535 A1 | 1/2013 | Yang et al. .................... 257/408 |

FOREIGN PATENT DOCUMENTS

| | | |
|---|---|---|
| CN | 101685188 A | 3/2010 |
| EP | 1930950 | 6/2008 |
| JP | 01-295458 | 11/1989 |
| JP | 03-256359 | 11/1991 |
| JP | 07-058308 A | 3/1995 |
| JP | 2002-026302 A | 1/2002 |
| JP | 2002-044522 A | 2/2002 |
| JP | 2002-051262 A | 2/2002 |
| JP | 2002-090462 A | 3/2002 |
| JP | 2002-344809 A | 11/2002 |
| JP | 2003-218332 A | 7/2003 |
| JP | 2003-318381 A | 11/2003 |
| JP | 2007-081083 A | 3/2007 |
| WO | 2009/146253 | 12/2009 |

* cited by examiner

SOLID-STATE IMAGING APPARATUS AND IMAGING SYSTEM

BACKGROUND OF THE INVENTION

1. Field of the Invention

The present invention relates to a solid-state imaging apparatus and an imaging system.

2. Description of the Related Art

An arrangement in which a photoelectric conversion element is partially covered with a light shielding layer is known as a radiation imaging apparatus. Japanese Patent Laid-Open No. 2002-51262 describes a light shielding portion which shields photoelectric conversion units against light and is provided such that their centers of gravity are aligned equidistantly.

SUMMARY OF THE INVENTION

In an imaging apparatus described in Japanese Patent Laid-Open No. 2002-51262, no light shielding portion is formed between adjacent photoelectric conversion elements, so a charge generated by light incident on the gap between the adjacent photoelectric conversion elements produces noise. The present invention in one aspect provides a novel layout of a light shielding layer which covers a photoelectric conversion element, and, in turn, provides a solid-state imaging apparatus with less noise.

A first aspect of the present invention provides a solid-state imaging apparatus comprising a plurality of pixels each including a photoelectric conversion element, and a light shielding layer which covers the photoelectric conversion element, wherein the light shielding layer comprises a first light shielding portion which covers at least part of a region between the photoelectric conversion elements that are adjacent to each other, and a second light shielding portion for partially shielding light incident on the photoelectric conversion element of each of the plurality of pixels, an aperture is provided for the light shielding layer, the remaining component of the incident light passing through the aperture, and a shape of the aperture includes a cruciform portion including a portion extending in a first direction and a portion extending in a second direction that intersects the first direction.

A second aspect of the present invention provides a solid-state imaging apparatus comprising a plurality of pixels each including a photoelectric conversion element, and a light shielding layer which covers the photoelectric conversion element, wherein the light shielding layer covers at least part of a region between the photoelectric conversion elements that are adjacent to each other, the light shielding layer comprises a light shielding portion for partially shielding light incident on the photoelectric conversion element of each of the plurality of pixels, and an aperture through which the remaining component of the incident light passes, and each aperture includes a plurality of cyclically arranged apertures.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1A:
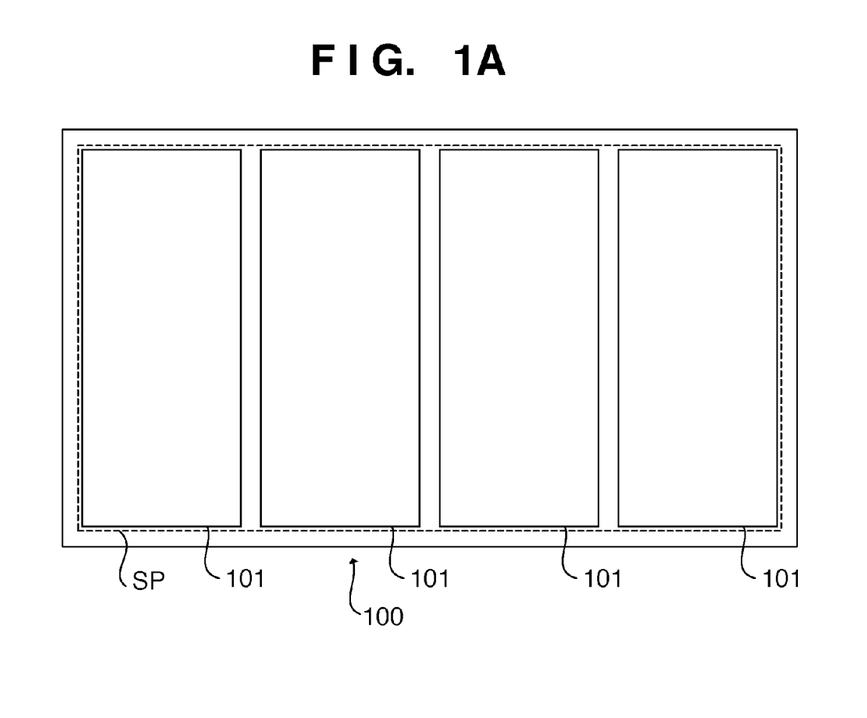
FIGS. 1A and 1B explain an example of the schematic arrangement of a solid-state imaging apparatus according to an embodiment of the present invention.
Figure 1B:
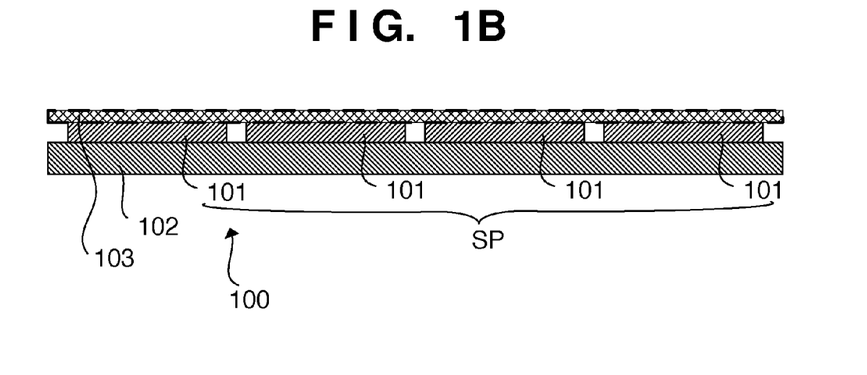

The schematic arrangement of a solid-state imaging apparatus 100 according to an embodiment of the present invention will be described with reference to FIGS. 1A and 1B. The solid-state imaging apparatus 100 can be formed by, for example, arraying a plurality of imaging blocks 101. In this case, an array of a plurality of imaging blocks 101 can form a sensor panel SP having one imaging region. The plurality of imaging blocks 101 can be arranged on a support substrate 102. When the solid-state imaging apparatus 100 uses a single imaging block 101, the single imaging block 101 forms the sensor panel SP. Each of the plurality of imaging blocks 101 may be provided by, for example, forming a circuit element on a semiconductor substrate or forming a semiconductor layer on, for example, a glass substrate and forming a circuit element on the semiconductor layer. Each of the plurality of imaging blocks 101 has a pixel array in which a plurality of pixels are arrayed so as to form pluralities of rows and columns.

The solid-state imaging apparatus 100 may serve as an apparatus which captures an image of radiation such as X-rays or an apparatus which captures an image of visible light. When the solid-state imaging apparatus 100 serves as an apparatus which captures an image of radiation, a scintillator 103 which converts radiation into visible light can typically be provided on the sensor panel SP. The scintillator 103 converts radiation into visible light, which strikes the sensor panel SP and is photoelectrically converted by each photoelectric conversion element on the sensor panel SP (imaging block 101).

Figure 2:
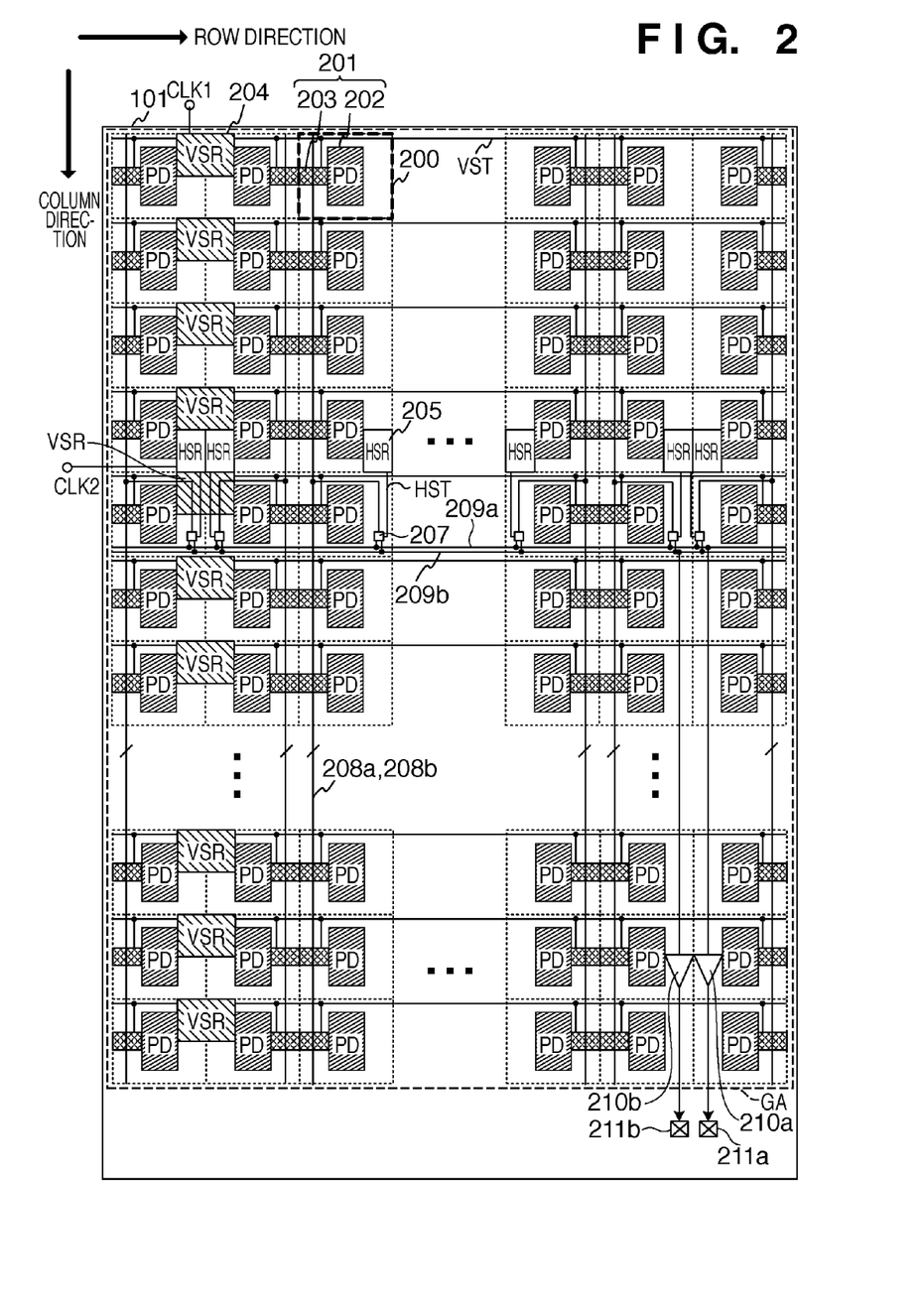
FIG. 2 explains an example of the arrangement of an imaging block according to the embodiment of the present invention.

An example of the arrangement of each imaging block 101 will be described next with reference to FIG. 2. When the solid-state imaging apparatus 100 uses a single imaging block 101, the single imaging block 101 can be regarded as a solid-state imaging apparatus. The imaging block 101 has a pixel array GA in which a plurality of pixels 201 are arrayed so as to form pluralities of rows and columns and a plurality of column signal lines 208a are arranged. Each of the plurality of pixels 201 includes a photoelectric conversion element (for example, a photodiode) 202, and an in-pixel readout circuit 203 which outputs a signal (light signal) corresponding to a charge generated by the photoelectric conversion element 202 to the column signal line 208a. In the pixel array GA, a plurality of column signal lines 208b may further be arranged, and the in-pixel readout circuit 203 can be configured to output noise generated by itself to the column signal line 208b in this case. In-pixel readout circuits 203 of two adjacent pixels 201 aligned in the row direction can be axisymmetrically arranged to have, for example, the boundary line between the two pixels 201 as their symmetry axis.

The imaging block 101 includes vertical scanning circuits 204 and horizontal scanning circuits 205. Although the vertical scanning circuit 204 can be placed, for example, between the photoelectric conversion elements 202 on two adjacent columns, it may be placed outside the photoelectric conversion element 202 on the outermost column in the pixel array GA. The vertical scanning circuit 204 includes, for example, a vertical shift register which performs a shift operation in accordance with a first clock CLK1, and scans a plurality of rows in the pixel array GA in accordance with the shift operation by the vertical shift register. The vertical shift register is formed by connecting a plurality of registers in series, and a pulse received by a register in the first stage is sequentially transferred to registers in subsequent stages in accordance with the first clock CLK1. A row corresponding to a register which holds a pulse is to be selected.

Although the horizontal scanning circuit 205 can be placed, for example, between the photoelectric conversion elements 202 on two adjacent rows, it may be placed outside the photoelectric conversion element 202 on the outermost row in the pixel array GA. The horizontal scanning circuit 205 includes, for example, a horizontal shift register which performs a shift operation in accordance with a second clock CLK2, and scans a plurality of columns in the pixel array GA in accordance with the shift operation by the horizontal shift register. The horizontal shift register is formed by connecting a plurality of registers in series, and a pulse received by a register in the first stage is sequentially transferred to registers in subsequent stages in accordance with the second clock CLK2. A column corresponding to a register which holds a pulse is to be selected.

The vertical scanning circuit 204 can be formed by vertically arraying a plurality of unit vertical scanning circuits VSR each including one register that constitutes the vertical shift register. Each unit vertical scanning circuit VSR can be placed in the region sandwiched by a photoelectric conversion element 202 of a pixel belonging to a given column (the leftmost column (that is, the first column) in FIG. 2) and a photoelectric conversion element 202 of a pixel belonging to a column adjacent to the given column (the second column from the left (that is, the second column) in FIG. 2). When a pulse is transferred via the vertical shift register, each unit vertical scanning circuit VSR drives a row select signal VST to active level so that pixels 201 on a row to which it belongs are selected. A light signal and noise from the pixel 201 on the selected row are output to the column signal lines 208a and 208b, respectively. Referring to FIG. 2, the column signal lines 208a and 208b are indicated by a single line. Pulse signals (start pulses) PULSE1 and PULSE2 are supplied to the input terminals (not shown) of the vertical scanning circuit 204 and horizontal scanning circuit 205, respectively.

The horizontal scanning circuit 205 can be formed by horizontally arraying a plurality of unit horizontal scanning circuits HSR each including one register that constitutes the horizontal shift register. Each unit horizontal scanning circuit HSR is placed in the region sandwiched by two photoelectric conversion elements 202 in each pair of two adjacent pixels (a pair of pixels on the first and second columns, a pair of pixels on the third and fourth columns, . . . ) belonging to one row (the fourth row from the top (that is, the fourth row) in FIG. 2). However, each unit horizontal scanning circuit HSR is not placed in the region sandwiched by two photoelectric conversion elements 202 in two adjacent pixels aligned in the column direction. This arrangement is advantageous to reduce the gap between the photoelectric conversion elements 202 in the column direction. When a pulse is transferred via the horizontal shift register, each unit horizontal scanning circuit HSR controls a switch 207 so that a column to which it belongs is selected, that is, the column signal lines 208a and 208b on this column are connected to horizontal signal lines 209a and 209b, respectively. That is, a light signal and noise from the pixel 201 on the selected row are output to the column signal lines 208a and 208b, respectively, and signals from the selected column (that is, the selected column signal lines 208a and 208b) are output to the horizontal signal lines 209a and 209b. This implements X-Y addressing. The horizontal signal lines 209a and 209b are connected to the inputs of output amplifiers 210a and 210b, respectively, and signals output to the horizontal signal lines 209a and 209b are amplified by the output amplifiers 210a and 210b, respectively, and output via pads 211a and 211b, respectively.

The pixel array GA can be regarded as being obtained by arraying a plurality of unit cells 200 each including the pixel 201 so as to form pluralities of rows and columns. The unit cells 200 can include several types. A certain unit cell 200 includes at least part of the unit vertical scanning circuit VSR. Although a set of two unit cells 200 includes only one unit vertical scanning circuit VSR in the example shown in FIG. 2, one unit cell 200 may include one unit vertical scanning circuit VSR or a set of three or more unit cells 200 may include one unit vertical scanning circuit VSR. Another unit cell 200 includes at least part of the unit horizontal scanning circuit HSR. Although one unit cell 200 includes one unit horizontal scanning circuit HSR in the example shown in FIG. 2, a set of a plurality of unit cells 200 may include one unit vertical scanning circuit VSR. Still another unit cell 200 includes both at least part of the unit vertical scanning circuit VSR and at least part of the unit horizontal scanning circuit HSR. Still another unit cell 200 includes, for example, a unit cell including at least part of the output amplifier 210a, a unit cell including at least part of the output amplifier 210b, and a unit cell including the switch 207.

An example of the arrangement of each pixel 201 will be described with reference to FIG. 3. The pixel 201 includes the photoelectric conversion element 202 and in-pixel readout circuit 203, as described earlier. The photoelectric conversion element 202 can typically be a photodiode. The in-pixel readout circuit 203 can include, for example, a first amplifier circuit 310, a clamp circuit 320, a light signal sample-and-hold circuit 340, and a noise sample-and-hold circuit 360, and NMOS transistors 343 and 363 and row select switches 344 and 364 in a second amplifier circuit.

The photoelectric conversion element 202 includes a charge storage unit, which is connected to the gate of a PMOS transistor 303 of the first amplifier circuit 310. The source of the PMOS transistor 303 is connected to a current source 305 via a PMOS transistor 304. A first source follower circuit is formed using the PMOS transistor 303 and current source 305. Forming a source follower circuit using the PMOS transistor 303 is effective in reducing 1/f noise. The PMOS transistor 304 serves as an enable switch which enables the first source follower circuit upon being turned on when an enable signal EN supplied to its gate changes to active level. The first amplifier circuit 310 outputs a signal corresponding to the potential of a charge/voltage conversion unit CVC to an intermediate node n1.

Figure 3:
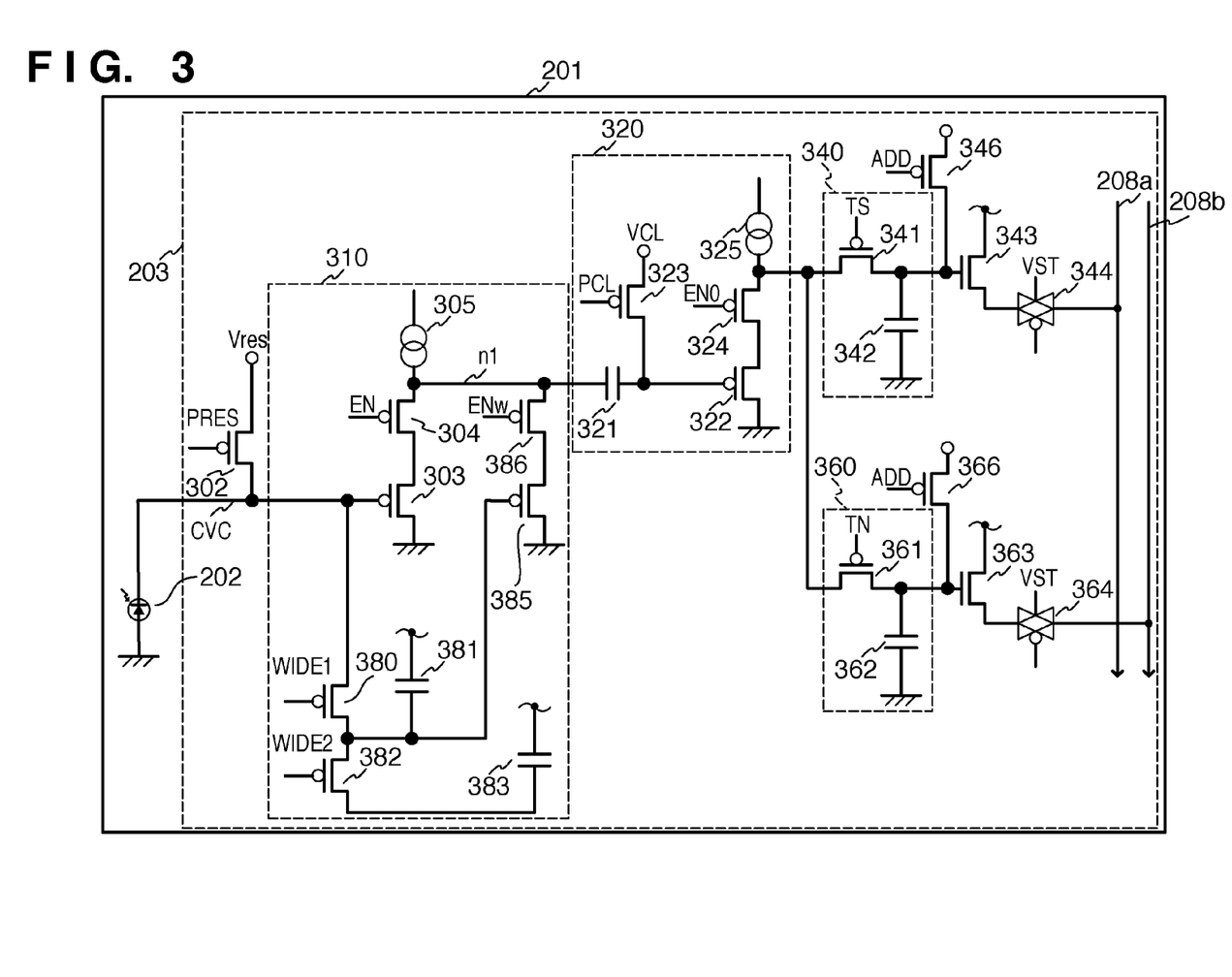
FIG. 3 explains an example of the arrangement of a pixel according to the embodiment of the present invention.

In the example shown in FIG. 3, the charge storage unit of the photoelectric conversion element 202 and the gate of the PMOS transistor 303 form a common node, which functions as the charge/voltage conversion unit CVC which changes a charge stored in the charge storage unit to a voltage. That is, the charge/voltage conversion unit CVC has the voltage V (=Q/C) determined by the charge Q stored in the charge storage unit and the capacitance value C of the charge/voltage conversion unit CVC. The charge/voltage conversion unit CVC is connected to a reset potential $V_{res}$ via a PMOS transistor 302 serving as a reset switch. When a reset signal PRES changes to active level, the PMOS transistor 302 is turned on, so the potential of the charge/voltage conversion unit CVC is reset to the reset potential $V_{res}$.

The clamp circuit 320 uses a clamp capacitance 321 to clamp noise output to the intermediate node n1 by the first amplifier circuit 310 in accordance with the reset potential of the charge/voltage conversion unit CVC. In other words, the clamp circuit 320 is a circuit for canceling that noise from a signal output from the first source follower circuit to the intermediate node n1 in accordance with the charge generated by the photoelectric conversion element 202. The noise output to the intermediate node n1 contains kTC noise produced upon resetting. Clamping is done by changing a clamp signal PCL to active level to turn on a PMOS transistor 323, and thereupon changing the clamp signal PCL to inactive level to turn off the PMOS transistor 323. The output terminal of the clamp capacitance 321 is connected to the gate of a PMOS transistor 322. The source of the PMOS transistor 322 is connected to a current source 325 via a PMOS transistor 324. A second source follower circuit is formed using the PMOS transistor 322 and current source 325. The PMOS transistor 324 serves as an enable switch which enables the second source follower circuit upon being turned on when an enable signal EN0 supplied to its gate changes to active level.

A signal output from the second source follower circuit in accordance with the charge generated by photoelectric conversion by the photoelectric conversion element 202 is written in a capacitance 342 as a light signal via a switch 341 when a light signal sampling signal TS changes to active level. A signal output from the second source follower circuit upon turning on the PMOS transistor 323 immediately after the potential of the charge/voltage conversion unit CVC is reset is noise. This noise is written in a capacitance 362 via a switch 361 when a noise sampling signal TN changes to active level. This noise contains the offset component of the second source follower circuit.

When the unit vertical scanning circuit VSR of the vertical scanning circuit 204 drives the row select signal VST to active level, a signal (light signal) held in the capacitance 342 is output to the column signal line 208a via the NMOS transistor 343 and row select switch 344 in the second amplifier circuit. At the same time, a signal (noise) held in the capacitance 362 is output to the column signal line 208b via the NMOS transistor 363 and row select switch 364 in the second amplifier circuit. The NMOS transistor 343 in the second amplifier circuit and a constant current source (not shown) provided on the column signal line 208a form a source follower circuit. Similarly, the NMOS transistor 363 in the second amplifier circuit and a constant current source (not shown) provided on the column signal line 208b form a source follower circuit.

The pixel 201 may include an add switch 346 which adds light signals from a plurality of adjacent pixels 201. In an add mode, an add mode signal ADD changes to active level, so the add switch 346 is turned on. Thus, the add switch 346 connects the capacitances 342 of adjacent pixels 201 to each other, thereby averaging the light signals. Similarly, the pixel 201 may include an add switch 366 which adds noise signals from a plurality of adjacent pixels 201. When the add switch 366 is turned on, the add switch 366 connects the capacitances 362 of adjacent pixels 201 to each other, thereby averaging the noise signals.

The pixel 201 may have a function for changing the sensitivity. The pixel 201 can include, for example, a first sensitivity change switch 380, a second sensitivity change switch 382, and a circuit element associated with them. When a first change signal WIDE1 changes to active level, the first sensitivity change switch 380 is turned on, so the capacitance value of a first additional capacitance 381 is added to that of the charge/voltage conversion unit CVC. This lowers the sensitivity of the pixel 201. When a second change signal WIDE2 changes to active level, the second sensitivity change switch 382 is turned on, so the capacitance value of a second additional capacitance 383 is added to that of the charge/voltage conversion unit CVC. This further lowers the sensitivity of the pixel 201.

In this manner, adding a function of lowering the sensitivity of the pixel 201 makes it possible to receive a larger amount of light, thus widening the dynamic range. When the first change signal WIDE1 changes to active level, an enable signal $EN_w$ may be changed to active level to enable a PMOS transistor 385 to perform a source follower operation, in addition to enabling the PMOS transistor 303 to perform a source follower operation.

Figure 4A:
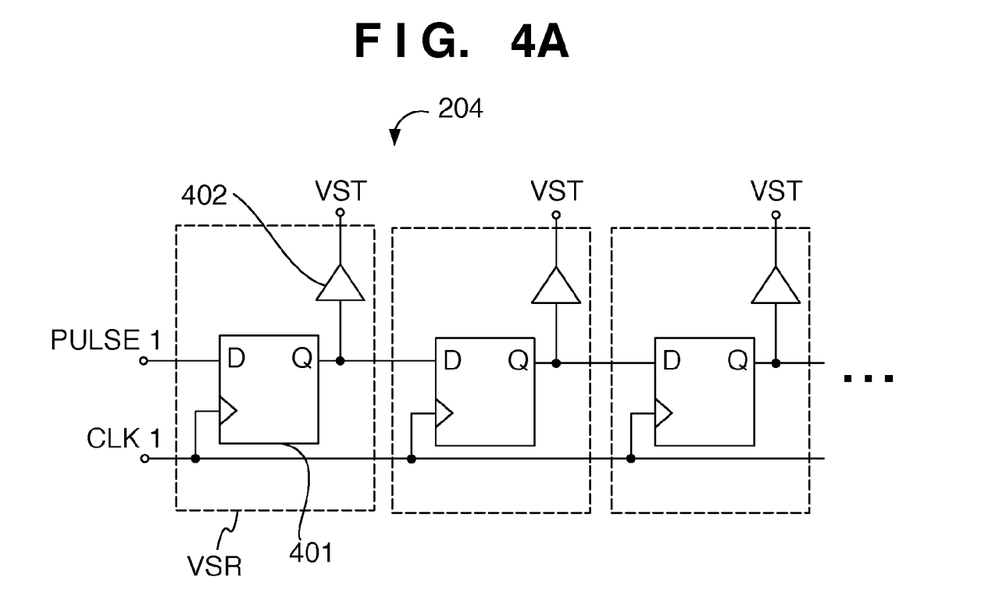
FIGS. 4A and 4B explain an example of the arrangements of shift registers according to the embodiment of the present invention.

Although the vertical scanning circuit 204 can have various arrangements, it can have an arrangement shown in, for example, FIG. 4A. In the vertical scanning circuit 204 shown in FIG. 4A, each unit vertical scanning circuit VSR includes one D-type flip-flop 401, and the first clock CLK1 is supplied to the clock input of the D-type flip-flop 401. The first pulse signal PULSE1 is supplied to the D input of the D-type flip-flop 401 of the unit vertical scanning circuit VSR in the first stage, and received in response to the first clock CLK1. The D-type flip-flop 401 in the first stage outputs a pulse signal having a duration corresponding to one cycle of the first clock CLK1 from its Q output. The Q output of the D-type flip-flop 401 of each unit vertical scanning circuit VSR is used to select a row to which the unit vertical scanning circuit VSR belongs, and is output as a row select signal VST via, for example, a buffer 402. The Q output of the D-type flip-flop 401 of each unit vertical scanning circuit VSR is connected to the D input of the D-type flip-flop 401 of the unit vertical scanning circuit VSR in the next stage.

Figure 4B:
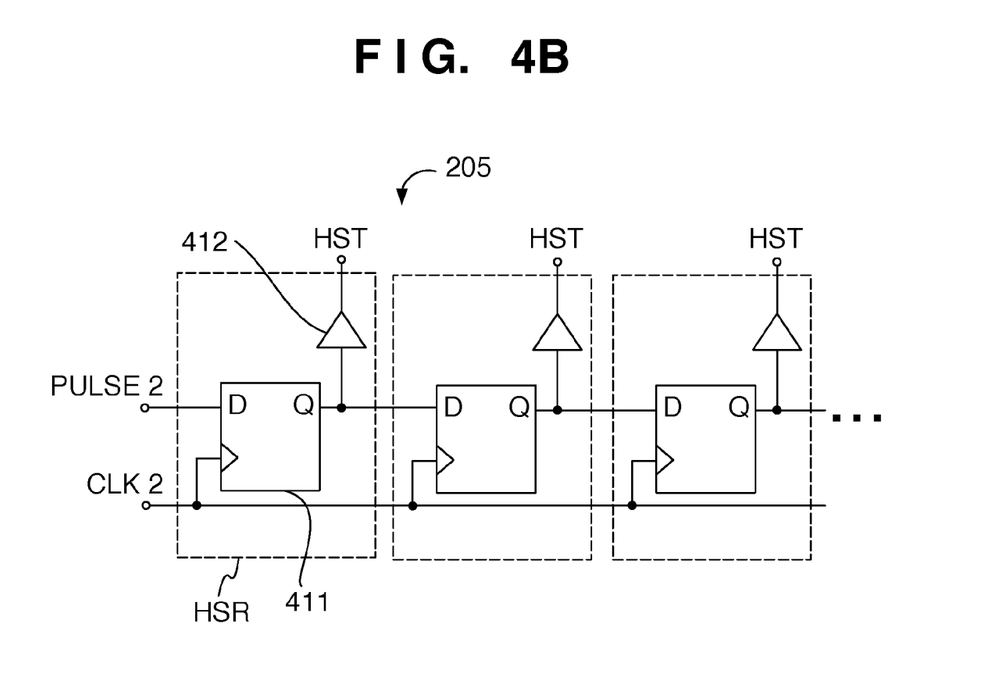

Although the horizontal scanning circuit 205 can have various arrangements, it can have an arrangement shown in, for example, FIG. 4B. In the horizontal scanning circuit 205 shown in FIG. 4B, each unit horizontal scanning circuit HSR includes one D-type flip-flop 411, and the second clock CLK2 is supplied to the clock input of the D-type flip-flop 411. The second pulse signal PULSE2 is supplied to the D input of the D-type flip-flop 411 of the unit horizontal scanning circuit HSR in the first stage, and received in response to the second clock CLK2. The unit horizontal scanning circuit HSR in the first stage outputs a pulse signal having a duration corresponding to one cycle of the second clock CLK2 from its Q output. The Q output of each unit horizontal scanning circuit HSR is used to select a column to which the unit horizontal scanning circuit HSR belongs, and is output as a column select signal HST via, for example, a buffer 412. The Q output of each unit horizontal scanning circuit HSR is connected to the D input of the D-type flip-flop 411 of the unit horizontal scanning circuit HSR in the next stage. Note that the vertical scanning period that is the scanning period of the vertical scanning circuit 204 is obtained by multiplying the horizontal scanning period of the horizontal scanning circuit 205 by the number of rows in the pixel array GA. The horizontal scanning period is the period of time required to scan all columns in the pixel array GA. Hence, the frequency of the second clock CLK2 supplied to the horizontal scanning circuit 205 which generates the column select signal HST used to select a column is greatly higher than that of the first clock CLK1 supplied to the vertical scanning circuit 204 which generates the row select signal VST used to select a row.

Figure 5:
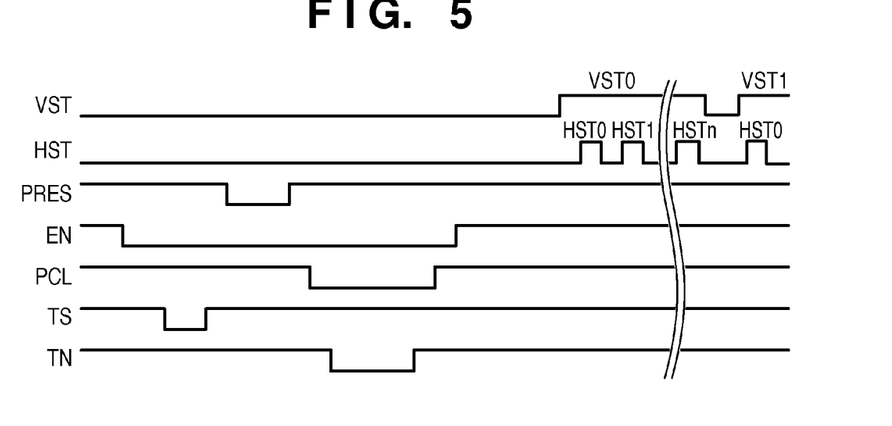
FIG. 5 explains an example of a timing chart according to the embodiment of the present invention.

Main signals supplied to each pixel 201 will be described with reference to FIG. 5. The reset signal PRES, enable signal EN, clamp signal PCL, light signal sampling signal TS, and noise sampling signal TN are low-active signals. Although not shown in FIG. 5, the enable signal EN0 can be a signal similar to the enable signal EN. Also, although not shown in FIG. 5, the enable signal $EN_w$ can make a transition in the same way as in the enable signal EN when the first change signal WIDE1 becomes active.

First, the enable signal EN becomes active on all rows in the pixel array GA, and the light signal sampling signal TS changes to active level in a pulsed pattern, so a light signal is written in the capacitance 342. Next, the reset signal PRES changes to active level in a pulsed pattern, so the potential of the charge/voltage conversion unit CVC is reset. The clamp signal PCL changes to active level in a pulsed pattern. When the clamp signal PCL is at active level, the noise sampling signal TN changes to active level in a pulsed pattern, so noise is written in the capacitance 362.

A unit vertical scanning circuit VSR corresponding to the first row of the vertical scanning circuit 204 changes its row select signal VST (VST0) to active level. This means that the vertical scanning circuit 204 selects the first row of the pixel array GA. In this state, unit horizontal scanning circuits HSR corresponding to the first to last columns of the horizontal scanning circuit 205 change their column select signals HST (HST0-HSTn) to active level. This means that the horizontal scanning circuit 205 sequentially selects the first to last columns of the pixel array GA. Thus, light signals and noise signals of pixels on the first to last columns on the first row of the pixel array GA are output from the output amplifiers 210a and 210b, respectively. After that, a unit vertical scanning circuit VSR corresponding to the second row of the vertical scanning circuit 204 changes its row select signal VST (VST1) to active level. Unit horizontal scanning circuits HSR corresponding to the first to last columns of the horizontal scanning circuit 205 change their column select signals HST (HST0-HSTn) to active level. By performing such an operation for the first to last rows, one image is output from the pixel array GA.

Figure 6:
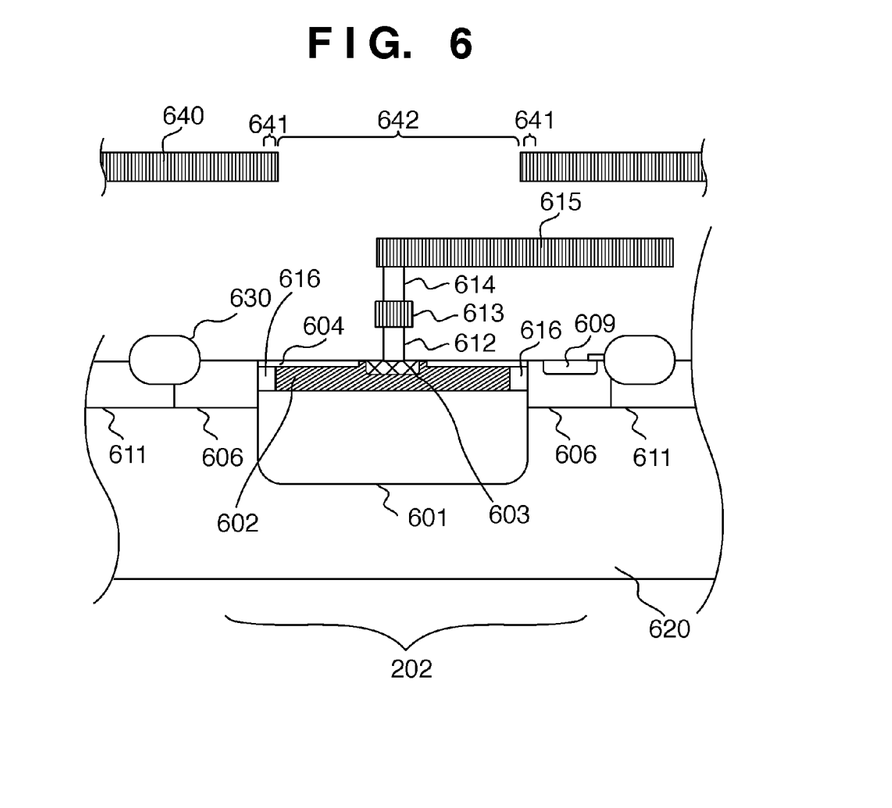
FIG. 6 explains an example of the arrangement of a photoelectric conversion element 202 according to the embodiment of the present invention.

An example of the arrangement of the photoelectric conversion element 202 will be described with reference to FIG. 6. The imaging block 101 can be formed on a substrate on which, for example, a semiconductor layer 620 of a second conductivity type is epitaxially grown on a semiconductor member (not shown) of the second conductivity type. Respective elements are isolated from each other by an element isolation portion 630. The photoelectric conversion element 202 of each pixel 201 includes, for example, an impurity region (well) 601 (first semiconductor region) of a first conductivity type formed in the semiconductor layer 620, and an impurity region 616 and inner region 602 which are formed on the impurity region 601. Both the impurity region 616 (second semiconductor region) and inner region 602 (third semiconductor region) are impurity regions of the second conductivity type. The inner region 602 has a higher impurity concentration for the second conductivity type than that of the impurity region 616, and is surrounded by the impurity region 616. That is, the inner region 602 is formed inside the impurity region 616. An electrode region 603 (fourth semiconductor region) that is an impurity region of the second conductivity type is formed inside the inner region 602. The electrode region 603 has a higher impurity concentration for the second conductivity type than that of the inner region 602. An impurity region 604 (fifth semiconductor region) of the first conductivity type is formed on the impurity region 616 and inner region 602. The impurity regions 602, 616, and 603 of the second conductivity type and the impurity regions 601 and 604 of the first conductivity type form a buried photodiode. In this case, the photoelectric conversion element 202 can be of the complete depletion type. When the photoelectric conversion element 202 is of the complete depletion type, the whole of the impurity regions 602 and 616 of the second conductivity type is depleted. In this embodiment, the charge storage unit of the photoelectric conversion element 202 functions as the charge/voltage conversion unit CVC. The photoelectric conversion element 202 can be completely depleted upon resetting the charge/voltage conversion unit CVC. Also, when the photoelectric conversion element 202 is not of the complete depletion type, most of the impurity regions 602 and 616 of the second conductivity type may be depleted.

An impurity region 606 of the first conductivity type surrounds the impurity region 601 of the first conductivity type on the upper side. The impurity region 606 is provided with a contact region 609 of the first conductivity type. An impurity region 611 of the second conductivity type surrounds the impurity region 606. In this embodiment, the photoelectric conversion element 202 uses a photodiode, and a predetermined voltage is applied to the impurity region 601 serving as one terminal of the photodiode via the impurity region 606. A charge generated when light strikes the photoelectric conversion element 202 and undergoes photoelectric conversion is collected in the inner region 602 and impurity region 616 and further in the electrode region 603. The electrode region 603 serving as the other electrode of the photoelectric conversion element 202 is connected to the in-pixel readout circuit 203 via a plug 612, a first metal layer 613, a plug 614, and a wiring pattern 615 formed in a second metal layer. In the above-mentioned example, the first conductivity type may be P type and the second conductivity type may be N type, or vice versa. Although the impurity region 616 and inner region 602 have the same junction depth in the example shown in FIG. 6, the junction depth may be larger in the impurity region 616 than in the inner region 602 or larger in the inner region 602 than in the impurity region 616. If the junction depth is larger in the impurity region 616 than in the inner region 602, the impurity region 616 may be formed under the inner region 602.

A light shielding layer 640 is formed over the unit cell 200 as a third metal layer. The light shielding layer 640 can include a light shielding portion 641 and aperture 642 at the position at which it covers the photoelectric conversion element 202. The light shielding portion 641 partially shields light incident on the photoelectric conversion element 202. On the other hand, the aperture 642 is formed at the position at which it overlaps the photoelectric conversion element 202 on a planar view, and passes the remaining component of the incident light. That is, incident light which passes through the aperture 642 can strike the photoelectric conversion element 202. The light shielding layer 640 can be formed in at least part of the region between adjacent photoelectric conversion elements. The light shielding layer 640 may be formed to cover the entire region between adjacent photoelectric conversion elements or cover, for example, only the unit vertical scanning circuit VSR or in-pixel readout circuit 203. A light shielding layer which covers the photoelectric conversion element 202, a light shielding layer which covers the unit vertical scanning circuit VSR, and a light shielding layer which covers the in-pixel readout circuit 203 may be formed in the same layer or separate layers. In this manner, by forming a light shielding layer in at least part of the region between adjacent photoelectric conversion elements, it is possible to reduce the amount of charge generated in a region other than the photoelectric conversion elements.

Figure 7A:
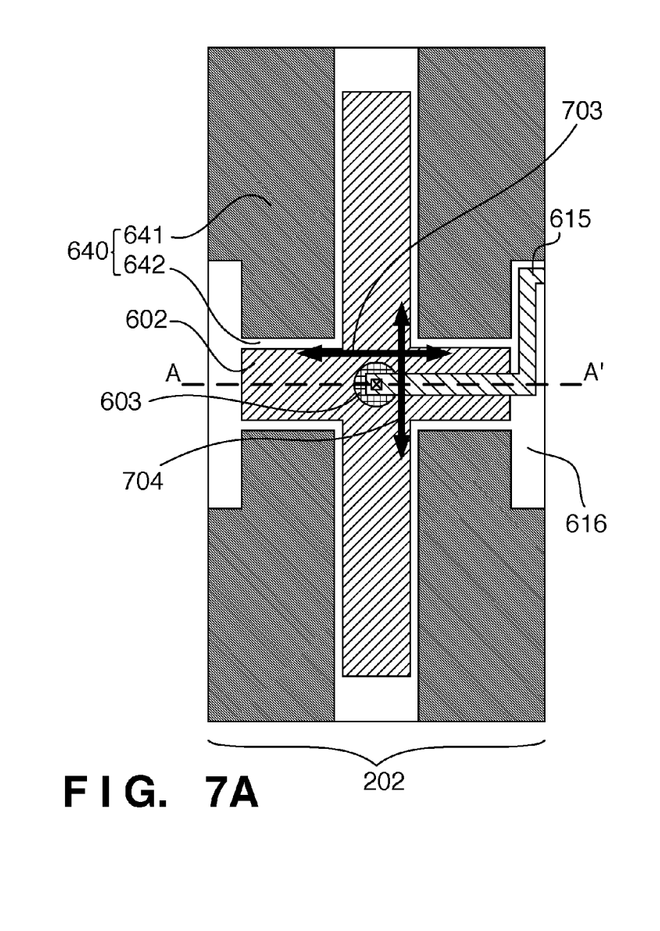
FIGS. 7A and 7B explain plan views of the photoelectric conversion element 202 according to the embodiment of the present invention.

Plan views of the photoelectric conversion element 202 will be explained next with reference to FIGS. 7A and 7B. FIG. 7A shows a plan view of the photoelectric conversion element 202, and FIG. 7B focuses attention only on the inner region 602 in this plan view. The photoelectric conversion element 202 described earlier with reference to FIG. 6 corresponds to a sectional view taken along a line A-A' in FIG. 7A. The impurity region 604 is not shown in FIG. 7A for the sake of ease of perceiving the shapes of the impurity region 616, inner region 602, and electrode region 603 on a planar view. An equipotential line is added as a broken line in FIG. 7B. In the following description, the simple expression "the shape of an impurity region" means "the shape of the impurity region on a planar view", unless otherwise specified. The inner region 602 is formed inside the impurity region 616 on a planar view, as shown in FIG. 7A. As described earlier, in the photoelectric conversion element 202 according to this embodiment, the impurity concentration increases in the order of the impurity region 616, the inner region 602, and the electrode region 603, thereby forming a potential gradient which increases toward the electrode region 603. The impurity region 616 has an impurity concentration of, for example, $1.0 \times 10^{15}$ cm$^{-3}$ to $1.0 \times 10^{17}$ cm$^{-3}$. The inner region 602 has an impurity concentration of, for example, $1.0 \times 10^{16}$ cm$^{-3}$ to $1.2 \times 10^{18}$ cm$^{-3}$. The electrode region 603 has an impurity concentration of, for example, $1.0 \times 10^{19}$ cm$^{-3}$ to $5.0 \times 10^{19}$ cm$^{-3}$. The light shielding portion 641 of the light shielding layer 640 is formed at the position at which it covers the four corners of the photoelectric conversion element 202, and the shape of the aperture 642 includes a cruciform portion as a result. That is, the shape of the aperture 642 can include a portion extending in a first direction 703 and a portion extending in a second direction 704. The first direction 703 and the second direction 704 intersect with each other. For example, the first direction 703 and the second direction 704 can be orthogonal to each other. In this manner, the dynamic range of the photoelectric conversion element 202 can be widened by partially covering it with the light shielding portion 641. When the amount of radiation light is reduced to widen the dynamic range, the average number of photons impinging on each pixel may decrease to one or less. Therefore, a temporal or spatial fluctuation of incident photons may produce noise (shot noise) and adversely affect an output image. With an arrangement provided with a light shielding layer which partially covers a photoelectric conversion element, the amount of light incident on the photoelectric conversion element can be reduced while maintaining a given amount of radiation light in order to reduce shot noise. Also, because the shape of the aperture 642 includes a cruciform portion, the photoelectric conversion element 202 can receive incident light regardless of whether the incident light is unevenly distributed to the inside of the photoelectric conversion element 202 or strikes the entire surface of the photoelectric conversion element 202. For example, if the solid-state imaging apparatus 100 includes no microlens for focusing incident light, and visible light converted by the scintillator 103 is guided to the photoelectric conversion element 202 without using a microlens, the incident light can strike the entire surface of the photoelectric conversion element 202. Also, if the solid-state imaging apparatus 100 includes a microlens, and visible light converted by the scintillator 103 is focused via the microlens and guided to the photoelectric conversion element 202, the incident light may be unevenly distributed to the inside of the photoelectric conversion element 202.

Figure 7B:
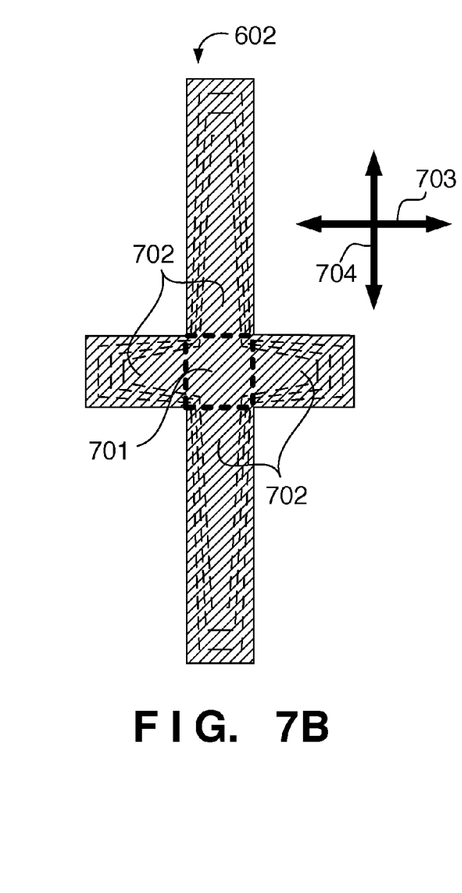

As shown in FIG. 7B, the inner region 602 can include a first portion 701 surrounded by a dotted line, and a plurality of second portions 702 extending from the first portion 701. The electrode region 603 can be included in the first portion 701 on a planar view. The first portion 701 and second portions 702 are defined for the sake of convenience in describing the shape of the inner region 602, so the inner region 602 can be formed as a region in which these portions are integrated in practice. In this embodiment, four second portions 702 extend in the directions in which cross lines run from the first portion 701. For example, adjacent second portions 702 may extend in orthogonal directions. Also, the width of the second portion 702 stays constant. The shape of the inner region 602 can be defined by the pattern of a photoresist mask used in impurity ion implantation. In this embodiment, by forming the inner region 602 in a cruciform shape, an increase in area of the inner region 602 can be suppressed while raising the charge collecting rate in the directions in which the second portions 702 extend. Because the impurity concentration is higher in the inner region 602 than in the impurity region 616, the depletion voltage of the photoelectric conversion element 202 rises as the area of the inner region 602 increases. By forming the inner region 602 in a cruciform shape, the depletion voltage of the photoelectric conversion element 202 can be kept low. Moreover, as will be described later, the collecting rate of charges from the directions in which the second portions 702 extend can be higher when the inner region 602 is formed in a cruciform shape than when the inner region 602 is formed in a convex polygon. Also, the electrode region 603 may be formed at the center of the impurity region 616. Thus, the electrode region 603 can evenly collect charges from the respective directions.

In this embodiment, both the aperture 642 and inner region 602 include cruciform shapes, which can overlap each other. That is, an intersection portion 710 of the cruciform portion in the aperture 642 and the first portion 701 overlap each other on a planar view, and the second portions 702 extend to overlap the aperture 642. Although the light shielding portion 641 does not overlap the inner region 602 at all in the example shown in FIG. 7A, part of the light shielding portion 641 and that of the inner region 602 may overlap each other. In this manner, by forming the aperture 642 and inner region 602 to overlap each other on a planar view, an increase in area of the inner region 602 can be suppressed while improving the charge collecting rate in the region in which incident light strikes the photoelectric conversion element 202. Moreover, as shown in FIG. 7A, the wiring pattern 615 may be formed at the position at which it overlaps the aperture 642 on a planar view. Thus, the parasitic capacitance between the light shielding layer 640 and the wiring pattern 615 can be decreased. Because the surface of the light shielding layer 640 sometimes does not become completely uniform, a variation in parasitic capacitance between the light shielding layer 640 and the wiring pattern 615 may occur between individual pixels. This variation between individual pixels can be reduced by decreasing the parasitic capacitance between the light shielding layer 640 and the wiring pattern 615.

Figure 8A:
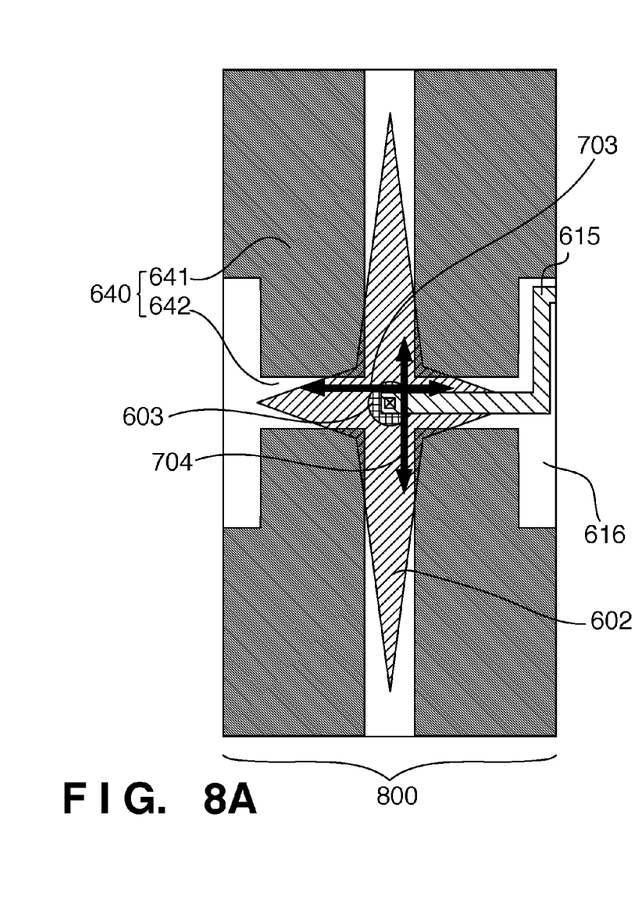
FIGS. 8A and 8B explain plan views of a photoelectric conversion element 800 according to another embodiment of the present invention.

A plan view of a photoelectric conversion element 800 according to another embodiment of the present invention will be described next with reference to FIGS. 8A and 8B. FIG. 8A shows a plan view of the photoelectric conversion element 800, and FIG. 8B focuses attention only on an inner region 802 in this plan view. The inner region 802 of the photoelectric conversion element 800 corresponds to the inner region 602 of the photoelectric conversion element 202 having been described with reference to FIGS. 7A and 7B, and is different only in shape from the inner region 602. Hence, only the shape of the inner region 802 in the photoelectric conversion element 800 will be described hereinafter, and a description of parts common to the photoelectric conversion element 202 will not be given. Although the light shielding layer 640 is transparently shown in FIG. 8A for the sake of ease of perceiving the shape of the inner region 802, visible light is shielded by the light shielding layer 640 in practice.

Figure 8B:
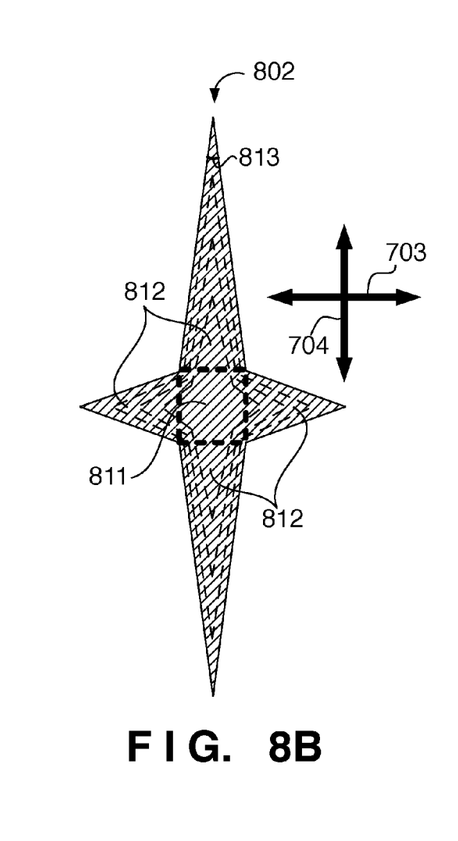

As shown in FIG. 8B, the inner region 802 can include a first portion 811 surrounded by a dotted line, and a plurality of second portions 812 extending from the first portion 811. The electrode region 603 can be included in the first portion 811. The first portion 811 and second portions 812 are defined for the sake of convenience in describing the shape of the inner region 802, so the inner region 802 can be formed as a region in which these portions are integrated in practice. In this embodiment as well, four second portions 812 extend in the directions in which cross lines run from the first portion 811. The second portion 812 has a taper shape, unlike the embodiment shown in FIGS. 7A and 7B. That is, the width of the second portion 812 decreases in a direction away from the first portion 811. As a result, the distal end of the second portion 812 can have an acute internal angle 813. In this embodiment as well, the aperture 642 and the inner region 802 can overlap each other on a planar view. Also, part of the light shielding portion 641 and that of the inner region 802 may overlap each other, as shown in FIG. 8A, or no parts of them may overlap each other.

Figure 9A:
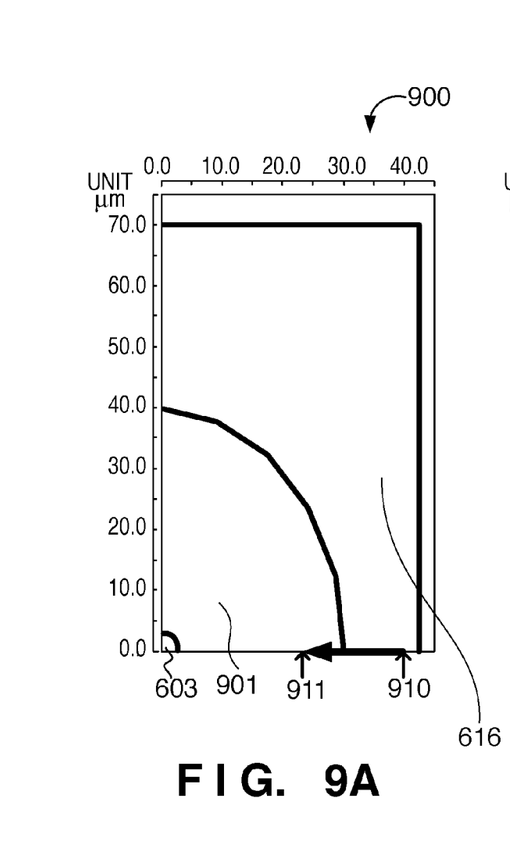
FIGS. 9A to 9C explain a difference in charge collecting rate due to factors associated with the shape of an inner region.
Figure 9B:
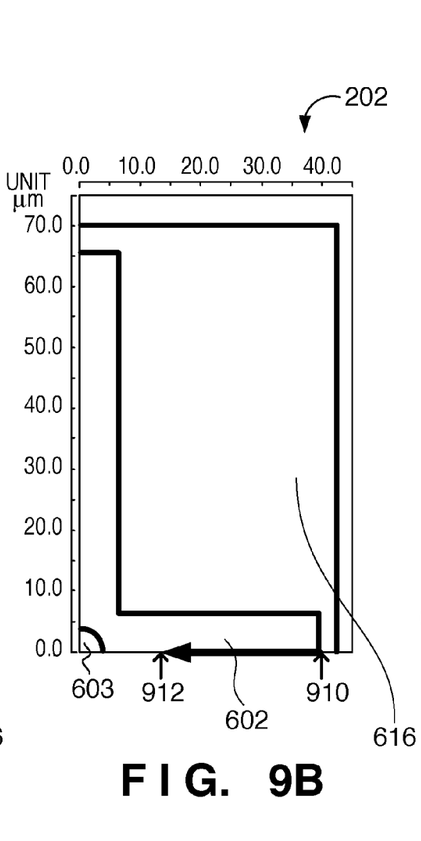
Figure 9C:
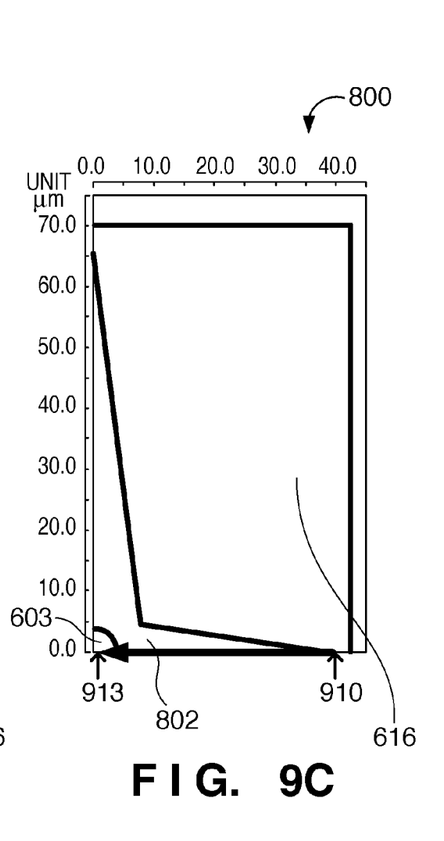

The difference in charge collecting rate due to factors associated with the shape of an impurity region will be described next with reference to FIGS. 9A to 9C. FIGS. 9A to 9C are plan views which focus attention on the upper right part of four parts obtained by two-dimensionally dividing the plan view of each photoelectric conversion element. FIG. 9A shows a plan view of a photoelectric conversion element 900 used as a Comparative Example. The photoelectric conversion element 900 includes the impurity region 616, an inner region 901, and the electrode region 603, and the impurity concentration increases in this order. The shape of the inner region 901 is a convex polygon. FIG. 9B shows the photoelectric conversion element 202 having been described with reference to FIGS. 7A and 7B, and FIG. 9C shows the photoelectric conversion element 800 having been described with reference to FIGS. 8A and 8B. A simulation associated with the distance by which an electron located at a position (a position of 40.0 µm to the right from the center of the electrode region 603) indicated by an arrow 910 drifts within a predetermined time was performed for each photoelectric conversion element. As shown in FIG. 9A, when the shape of the inner region 901 is a convex polygon, the electron drifted to a position (a position of about 23 µm to the right from the center of the electrode region 603) indicated by an arrow 911 after the predetermined time. As shown in FIG. 9B, when the inner region 602 has a cruciform shape, the electron drifted to a position (a position of about 13 µm to the right from the center of the electrode region 603) indicated by an arrow 912 after the predetermined time. As shown in FIG. 9C, when the inner region 802 has a tapered cruciform shape, the electron drifted to a position (a position of about 1 µm to the right from the center of the electrode region 603) indicated by an arrow 913 after the predetermined time. In this manner, forming the inner region 602 in a cruciform shape makes it possible to raise the charge collecting rate in the direction in which the second portion of the inner region extends. Also, forming the second portion of the inner region in a taper shape makes it possible to further raise the charge collecting rate in the direction in which the second portion tapers.

Figure 10:
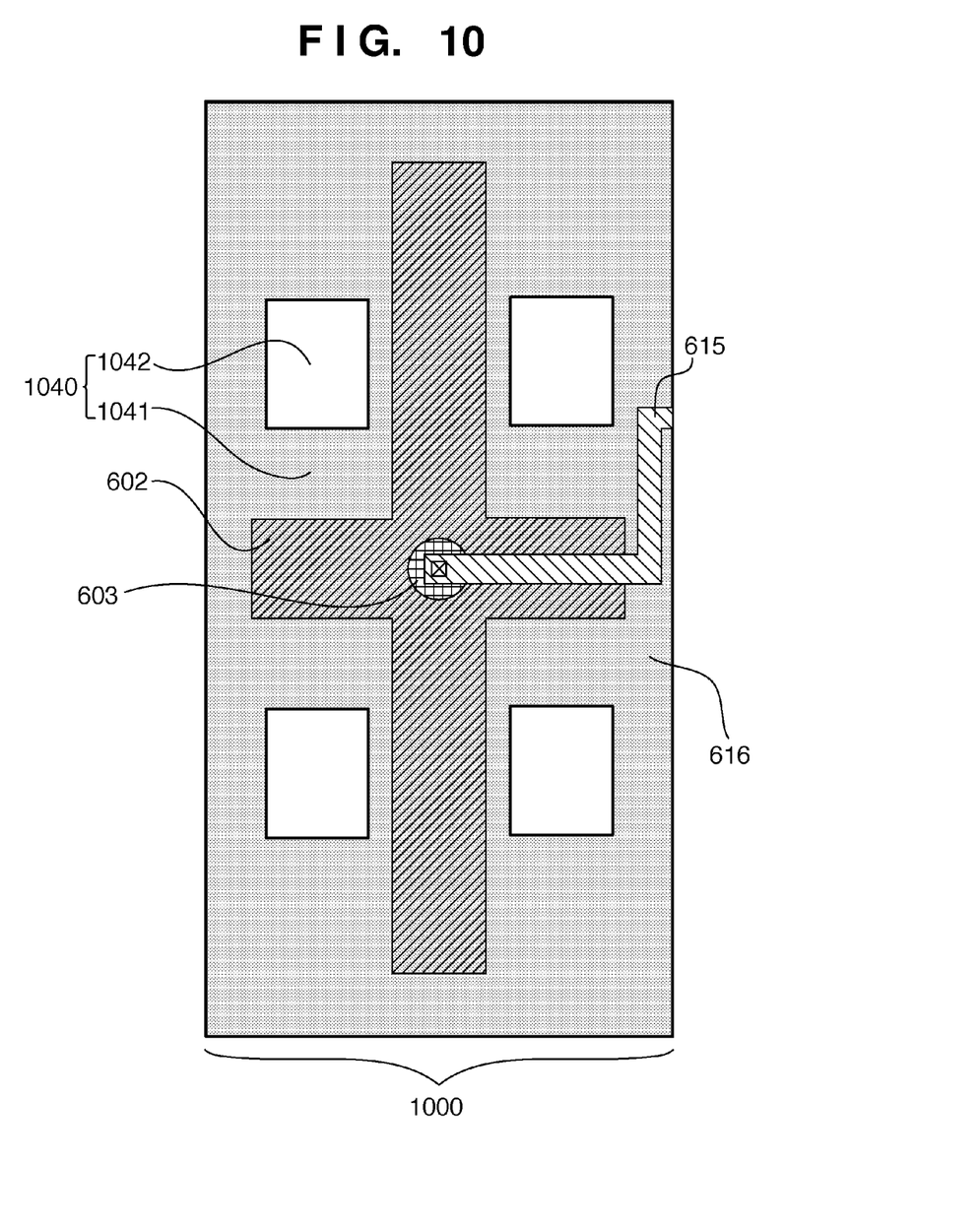
FIG. 10 explains a plan view of a photoelectric conversion element 1000 according to still another embodiment of the present invention.

Still another embodiment of the present invention will be described next with reference to FIG. 10. A photoelectric conversion element 1000 according to this embodiment is different only in shape of a light shielding layer 1040 from the photoelectric conversion element 202 having been described with reference to FIGS. 7A and 7B. Hence, only the shape of the light shielding layer 1040 will be described hereinafter, and a description of parts common to the photoelectric conversion element 202 mentioned above will not be given. The light shielding layer 1040 is transparently shown for the sake of ease of viewing in FIG. 10 as well. The light shielding layer 1040 can include a light shielding portion 1041 and aperture 1042 at the position at which it covers the photoelectric conversion element 1000. The light shielding portion 1041 partially shields light incident on the photoelectric conversion element 1000. On the other hand, the aperture 1042 is formed at the position at which it covers the photoelectric conversion element 1000, and passes the remaining component of the incident light. That is, incident light which passes through the aperture 1042 can strike the photoelectric conversion element 1000. A light shielding layer which covers the photoelectric conversion element 1000, a light shielding layer which covers the unit vertical scanning circuit VSR, and a light shielding layer which covers the in-pixel readout circuit 203 may be formed in the same layer or separate layers. The aperture 1042 includes a plurality of cyclically distributed apertures. The plurality of apertures may have the same shape. In this embodiment, the dynamic range of the photoelectric conversion element 1000 can be widened by partially covering it with the light shielding portion 1041.

Figure 11:
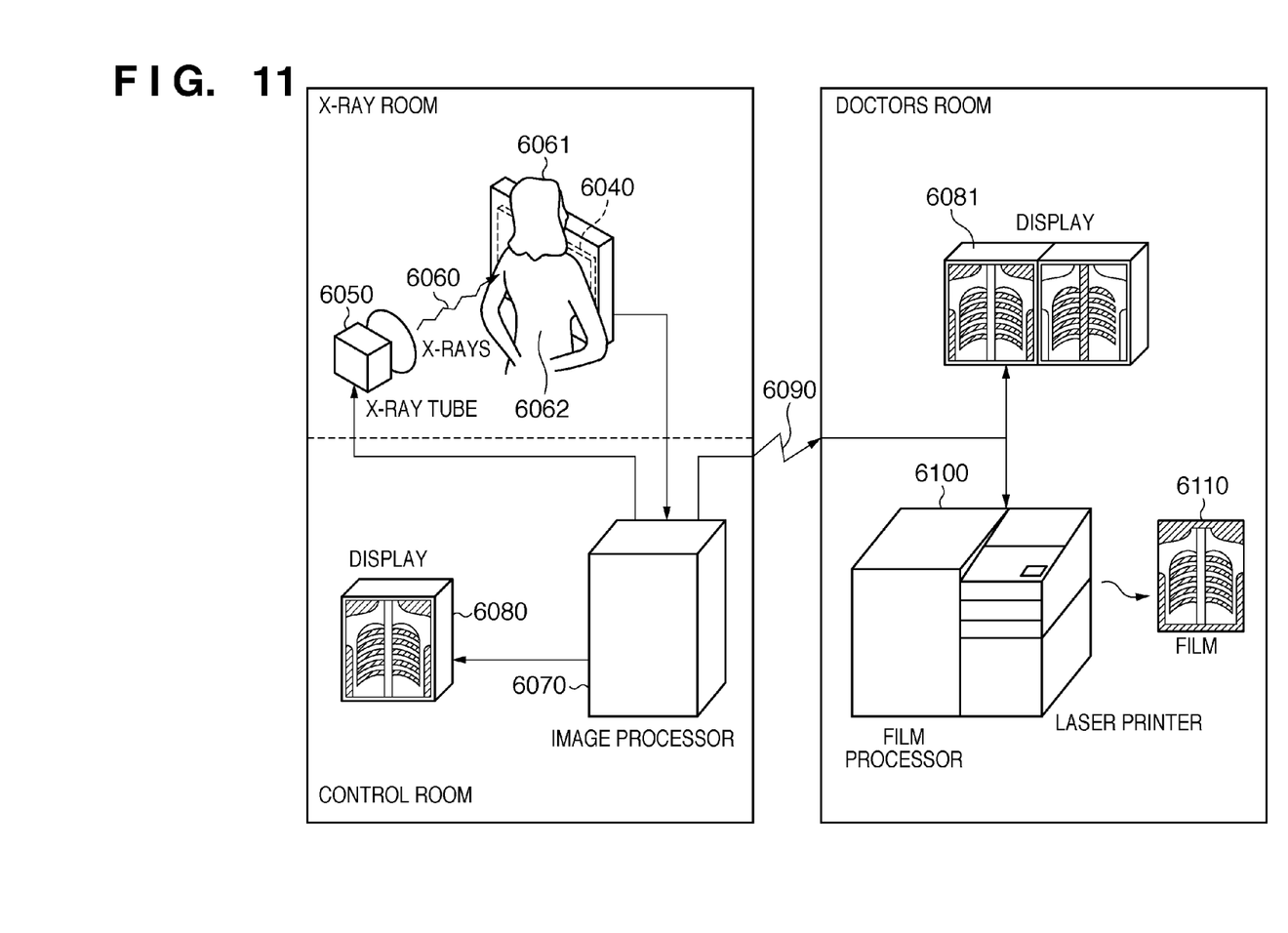
FIG. 11 illustrates a radiation imaging system according to an embodiment of the present invention.

FIG. 11 illustrates an example in which the solid-state imaging apparatus according to the present invention is applied to an X-ray diagnostic system (radiation imaging system). The radiation imaging system includes a radiation imaging apparatus 6040 and an image processor 6070 which processes a signal output from the radiation imaging apparatus 6040. The radiation imaging apparatus 6040 serves as an apparatus to which the solid-state imaging apparatus 100 mentioned above is applied so as to capture radiation as illustrated in FIG. 1B. X-rays 6060 emitted by an X-ray tube (radiation source) 6050 are transmitted through a chest 6062 of a patient or a subject 6061, and enter the radiation imaging apparatus 6040. The incident X-rays bear the information of the interior of the body of the subject 6061. The image processor (processor) 6070 processes a signal (image) output from the radiation imaging apparatus 6040, and can display the image on, for example, a display 6080 in a control room based on the signal obtained by processing.

Also, the image processor 6070 can transfer the signal obtained by processing to a remote site via a transmission path 6090. This makes it possible to display the image on a display 6081 placed in, for example, a doctor room at another site or record the image on a recording medium such as an optical disk. The recording medium may be a film 6110, and a film processor 6100 records the image on the film 6110 in this case.

The solid-state imaging apparatus according to the present invention is also applicable to an imaging system which captures an image of visible light. Such an imaging system can include, for example, the solid-state imaging apparatus 100 and a processor which processes a signal output from the solid-state imaging apparatus 100. The processing by the processor can include at least one of, for example, processing of converting the image format, processing of compressing the image, processing of changing the image size, and processing of changing the image contrast.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-155256, filed Jul. 7, 2010, which is hereby incorporated by reference herein in its entirety.

What is claimed is:

1. A solid-state imaging apparatus comprising:
a plurality of pixels, each including a photoelectric conversion element, and a light shielding layer that covers said photoelectric conversion element,
wherein said light shielding layer includes:
a first light shielding portion that covers at least part of a region between the photoelectric conversion elements that are adjacent to each other,
a second light shielding portion for that partially shields said photoelectric conversion element of each of said plurality of pixels from incident light, and
an aperture, through which the remaining component of the incident light passes,
wherein said aperture has a shape that includes a cruciform portion having a portion extending in a first direction and a portion extending in a second direction that intersects said first direction,
wherein each of said plurality of pixels further includes an in-pixel read-out circuit configured to output a signal corresponding to a charge generated by said photoelectric conversion element to a signal line, and
wherein said photoelectric conversion element includes:
a first semiconductor region having a first conductivity type,
a second semiconductor region, located over said first semiconductor region, having a second conductivity type different from said first conductivity type, and
a third semiconductor region, located inside said second semiconductor region, having said second conductivity type and a higher impurity concentration than that of said second semiconductor region,
wherein said third semiconductor region includes a first portion that overlaps an intersection portion with said cruciform portion, and a plurality of second portions that extend to overlap said aperture in both said first direction and said second direction.

2. The solid-state imaging apparatus according to claim 1, wherein said photoelectric conversion element further includes:
a fourth semiconductor region of said second conductivity type, located inside said third semiconductor region, that is connected to said in-pixel read-out circuit and has a higher impurity concentration than that of said third semiconductor region,
wherein said fourth semiconductor region is located inside said first portion of said third semiconductor region, and
wherein said second light shielding portion covers at least a region in which said third semiconductor region of said photoelectric conversion element is not provided.

3. The solid-state imaging apparatus according to claim 2, wherein a width of each of said plurality of second portions decreases in a direction away from said first portion.

4. The solid-state imaging apparatus according to claim 2, wherein part of a wiring pattern which connects said fourth semiconductor region and said in-pixel read-out circuit is arranged so as to overlap said aperture.

5. A solid-state imaging apparatus comprising:
a plurality of pixels, each including a photoelectric conversion element, and a light shielding layer that covers said photoelectric conversion element,
wherein said light shielding layer includes:
a first light shielding portion that covers at least part of a region between photoelectric conversion elements that are adjacent to each other,
a second light shielding portion that partially said photoelectric conversion element of each of said plurality of pixels from incident light, and
an aperture, through which the remaining component of the incident light passes,
wherein said aperture has a shape that includes a cruciform portion having a portion extending in a first direction and a portion extending in a second direction that intersects said first direction,
wherein each of said plurality of pixels further includes an in-pixel read-out circuit configured to output a signal corresponding to a charge generated by said photoelectric conversion element to a signal line, and
wherein part of a wiring pattern that connects said photoelectric conversion element and said in-pixel read-out circuit so as to overlap said aperture.

6. A solid-state imaging apparatus comprising:
a plurality of pixels, each including a photoelectric conversion element, and a light shielding layer that covers said photoelectric conversion element,
wherein said light shielding layer includes:
a first light shielding portion that covers at least part of a region between photoelectric conversion elements that are adjacent to each other,
a second light shielding portion that partially shields said photoelectric conversion element of each of said plurality of pixels from incident light, and
an aperture, through which the remaining component of the incident light passes,
wherein said aperture has a shape that includes a cruciform portion having a portion extending in a first direction and a portion extending in a second direction that intersects said first direction; and
a scintillator provided over said photoelectric conversion element,
wherein light converted by said scintillator is irradiated to said photoelectric conversion element without passing through a microlens for condensing the light into said photoelectric conversion element.

7. An imaging system comprising:
a solid-state imaging apparatus that includes:
a plurality of pixels, each including a photoelectric conversion element, and a light shielding layer that covers said photoelectric conversion element,
wherein said light shielding layer includes:

a first light shielding portion that covers at least part of a region between photoelectric conversion elements that are adjacent to each other, a second light shielding portion that partially shields said photoelectric conversion element of each of said plurality of pixels from incident light, and an aperture, through which the remaining component of the incident light passes, wherein said aperture has a shape that includes a cruciform portion having a portion extending in a first direction and a portion extending in a second direction that intersects said first direction, wherein each of said plurality of pixels further includes an in-pixel read-out circuit configured to output a signal corresponding to a charge generated by said photoelectric conversion element to a signal line, and wherein said photoelectric conversion element includes:
a first semiconductor region having a first conductivity type,
a second semiconductor region, located over said first semiconductor region, having a second conductivity type different from said first conductivity type, and
a third semiconductor region, located inside said second semiconductor region, having said second conductivity type and a higher impurity concentration than that of said second semiconductor region,
wherein said third semiconductor region includes a first portion that overlaps an intersection portion with said cruciform portion, and a plurality of second portions that extend to overlap said aperture in both said first direction and said second direction; and a processor configured to process a signal output from the said solid-state imaging apparatus.

8. A solid-state imaging apparatus comprising:
a plurality of pixels, each including a photoelectric conversion element, and a light shielding layer that covers said photoelectric conversion element,
wherein the light shielding layer covers at least part of a region between photoelectric conversion elements that are adjacent to each other,
wherein the light shielding layer includes:
a light shielding portion that partially shields said photoelectric conversion element of each of said plurality of pixels from incident light, and
an aperture portion through which the remaining component of the incident light passes, and
wherein said aperture portion in each said pixel includes a plurality of cyclically arranged apertures on said photoelectric conversion element.

9. The solid-state imaging apparatus according to claim 8, further comprising:
a scintillator provided over said photoelectric conversion element,
wherein light converted by said scintillator is irradiated to said photoelectric conversion element without passing through a microlens for condensing the light into said photoelectric conversion element.

10. An imaging system comprising:
a solid-state imaging apparatus that includes:
a plurality of pixels, each including a photoelectric conversion element, and a light shielding layer that covers said photoelectric conversion element,
wherein said light shielding layer covers at least part of a region between photoelectric conversion elements that are adjacent to each other,
wherein said light shielding layer includes:
a light shielding portion that partially shields said photoelectric conversion element of each of said plurality of pixels from incident light, and
an aperture portion through which the remaining component of the incident light passes, and
wherein said aperture portion in each said pixel includes a plurality of cyclically arranged apertures on said photoelectric conversion element; and
a processor configured to process a signal output from the said solid-state imaging apparatus.

* * * * *